United States Patent [19]
Drach et al.

[11] Patent Number: 5,451,866
[45] Date of Patent: Sep. 19, 1995

[54] QUICK-MOUNT MEASURING DEVICE FOR EVALUATING THE ELECTRICAL CHARACTERISTICS OF FERROELECTRIC MATERIALS

[75] Inventors: William C. Drach, Tinton Falls; Thomas E. Koscica, Clark; Richard W. Babbitt, Fair Haven, all of N.J.

[73] Assignee: The United States of America as represented by the Secretary of the Army, Washington, D.C.

[21] Appl. No.: 296,825

[22] Filed: Aug. 26, 1994

[51] Int. Cl.$^6$ .......................................... G01R 31/02
[52] U.S. Cl. .................. 324/158.1; 324/760; 324/106
[58] Field of Search ............ 324/158.1, 73.1, 760, 324/765, 106; 209/219; 437/8; 165/80.3, 134; 219/483, 464

[56] References Cited
U.S. PATENT DOCUMENTS

| | | | |
|---|---|---|---|
| 3,979,671 | 9/1976 | Meeker et al. | 324/760 |
| 4,839,587 | 6/1989 | Flatley et al. | 324/760 |
| 4,962,355 | 10/1990 | Holderfield et al. | 324/760 |
| 5,001,423 | 3/1991 | Abrami et al. | 324/760 |
| 5,006,796 | 4/1991 | Burton et al. | 324/760 |

*Primary Examiner*—Vinh P. Nguyen
*Attorney, Agent, or Firm*—Michael Zelenka; James A. Digiorgio

[57] ABSTRACT

A device for measuring the electrical characteristics of a ferromagnetic material as a function of temperature, such as its dielectric constant verses temperature characteristics. The device having a quick mount fixture that utilizes a gravity feed and thermal grease to insure a quick reliable thermal connection between the temperature controller and the device under test (DUT). In addition, the device can be remotely controlled by a computer to automate the measuring procedure, thus reducing measuring time and alleviating the intensive manual procedure of making such measurements. Moreover, the device is easily mountable in a humidity-free or desiccation chamber to insure the measurements are reliable and accurate.

2 Claims, 1 Drawing Sheet

QUICK-MOUNT MEASURING DEVICE FOR EVALUATING THE ELECTRICAL CHARACTERISTICS OF FERROELECTRIC MATERIALS

GOVERNMENT INTEREST

The invention described herein may be manufactured, used, and licensed by or for the government of the United States of America for governmental services without the payment to us of any royalty thereon.

NOTICE OF RELATED INVENTION

The invention described herein is related to the applicants' co-pending application Serial No. 08/296,824, entitled "Means For Evaluating Temperature Characteristics of Ferroelectric Materials," and incorporated herein by reference.

FIELD OF THE INVENTION

This invention relates to the field of measuring the characteristics of ferroelectric materials, and more specifically to a device that provides temperature controlled measurements of ferroelectric materials.

BACKGROUND OF THE INVENTION

Heretofore, devices used to measure the electrical characteristics of a ferroelectric material, such as its dielectric constant versus temperature or its dielectric constant versus electric potential, have been comprised of a temperature controlled plate and a holder for the ferroelectric material or device under test (DUT). In these prior art devices, the DUT is thermally connected to the temperature controlled plate and electrically connected to probes for measuring the actual dielectric constant change over a range of temperatures. Essentially, these devices require a very time consuming and manually intensive data taking procedure for taking such measurements. As a result, the DUT could be exposed to external air or unwanted environmental conditions for a significant period of time.

This exposure to unwanted environmental conditions (i.e. humidity), however, directly affects the accuracy and reliability of the desired measurements. Specifically, the lower the humidity, the greater the reliability of the measurement. As a result, the prior art devices tend to provide inaccurate and unreliable measurements.

Moreover, these devices fail to provide a quick-mounting means that is truly reliable for insuring that there is intimate thermal contact between the DUT and the temperature controlled plate. As a result, the DUT may not be fully exposed to the desired testing temperature, and thus add to the unreliability of the measurements.

As a result, those skilled in the art would greatly welcome any device that could measure a ferroelectric material's dielectric constant as a function of temperature with minimal exposure to outside or unwanted environmental conditions, in a more timely, more reliable, and less manually intensive manner.

SUMMARY OF THE INVENTION

Accordingly, the present invention provides a quick-mount measuring device that provides a highly reliable and more timely means of measuring the dielectric constant of a ferroelectric material over a predetermined range of temperatures. To attain this, the present invention provides a measuring device having a quick-mount DUT fixture that utilizes a gravity feed and thermal grease to facilitate a quick thermal connection between the DUT and the temperature controller module.

More specifically, the present invention is composed of a quick-mount or quick-connect DUT fixture that utilizes a gravity feed and thermal grease to thermally connect the DUT to a temperature controller module having a temperature plate that can be remotely controlled by a computer to automatically adjust the temperature on which the DUT is exposed within a predetermined range. In addition, the present invention provides easy placement of the DUT into a humidity free chamber (i.e. desiccation chamber) without compromising the intimate thermal contact between the DUT and the temperature controlled plate. This insures that the DUT can be tested in a dry (low humidity) environment, and thus insures highly reliable measurements.

In a preferred embodiment of the invention, the temperature controller module is composed of a temperature plate, a thermoelectric cooler, a heat sink, and a precision temperature sensor. The thermoelectric cooler is held between the temperature controlled plate and the heat sink by four bolts which are electrically and thermally insulated from the heat sink. The precision temperature sensor is mounted in the temperature controlled plate.

The quick-mount DUT fixture is composed of a hold-down bar, spring-loaded screws, a top thermal grease surface, and a bottom surface. The bottom surface of the DUT fixture is mounted on the temperature controlled plate directly above the precision temperature sensor. The DUT, in turn, is placed on the thermal greased surface and held onto that surface by a hold-down bar, positioned on the top surface of the DUT, opposite to the thermal greased surface. As a result, the quick-mount fixture is thermally connected to the temperature controlled plate, directly above the temperature sensor, and thus the DUT is intimately, thermally connected to the temperature controlled plate through the thermal grease. Consequently, the quick-mount DUT fixture facilitates quick-placement of the DUT in thermal contact with the temperature controlled plate, whereas the hold-down bar and the thermal grease facilitate an intimate and reliable gravity feed contact between the temperature controlled plate and the DUT.

Moreover, the entire temperature controller module can be remotely computer controlled. Specifically, (1) the temperature sensor can be electronically read by the computer through electronic leads attached to the sensor, (2) the thermoelectric cooler can be electronically powered to any desired temperature within a predetermined range through a computer controlled power supply, and (3) the heat sink can be thermally controlled by water, maintained at room temperature through an external heat exchanger, circulating through the heat sink. Consequently, the present invention overcomes, to a large extent, the problems that have beset the measuring devices of the prior art.

These and other features of the invention are described in more complete detail in the following description of the preferred embodiment when taken with the drawings. The scope of the invention, however, is limited only by the claims appended hereto.

DETAILED DESCRIPTION OF THE INVENTION

Figure 1:
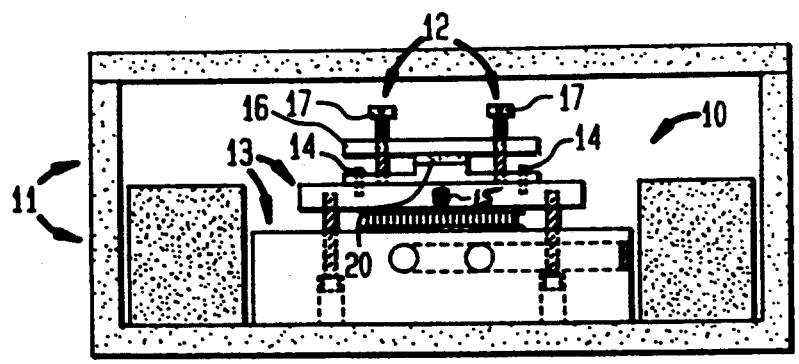
FIG. 1 is a pictorial view of a preferred embodiment of the invention in a humidity free chamber.

Referring now to FIG. 1, there is shown material characterization device 10 mounted in a desiccator or humidity-free chamber 11. Device 10 is composed of a quick-mount DUT fixture 12 which is mechanically connected to temperature controller module 13 by a plurality of hold-down pins 14. Ferroelectricmaterial or DUT 20 is clamped to quick-mount fixture 12 by a hold-down bar 16 which is attached to fixture 12 by spring-loaded screws 17.

Figure 2:
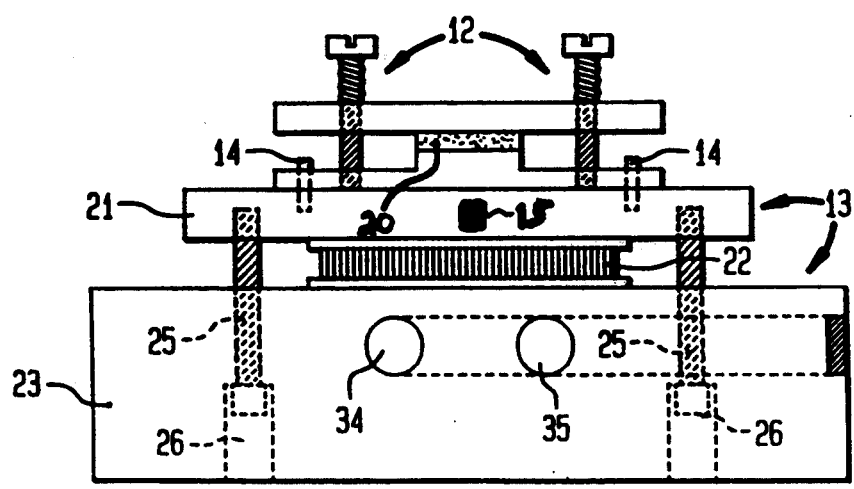
FIG. 2 is a side pictorial view of a preferred embodiment of the invention.

As shown in FIG. 2, temperature control module 13 is composed of a temperature controlled plate 21, a thermoelectric cooler 22, and a heat sink 23. The quick-mount fixture 12 is held in place on the temperature controlled plate 21 by four hold-down pins 14 (only two are shown). The thermoelectric cooler 22 is held between temperature controlled plate 21 and heat sink 23 by bolts 25. Bolts 25 are electrically and thermally insulated from the heat sink by spacers 26 which can be made of TEFLON ®.

A precision temperature sensor 15 is mounted in temperature controlled plate 21 directly below DUT 20. Electrical leads (not shown) from temperature sensor 15 can be feed to a computer (not shown) for automatic sensing. In addition, thermoelectric cooler 22 can be powered by a computer controlled power supply (not shown). As a result, the computer (not shown) can establish a feedback loop between temperature sensor 15 and thermoelectric cooler 22 such that precision computer control of DUT 20's temperature can be maintained. In addition, heat sink 23 maintains its ambient temperature by water that circulates through water lines 34 and 35.

In operation, DUT 20 is painted on its top and bottom surface with a metal such as silver, connected to data taking wires (not shown), and clamped to quick-mount fixture 12. A computer controlled power supply (not shown) can supply current to thermoelectric cooler 22 through electric leads (not shown), and thus control the temperature supplied to DUT 20. The computer (not shown) can then read the temperature of temperature controlled plate 21 through temperature sensor 15, and adjust the current to thermoelectric cooler 22 so that the predetermined or desired temperature is within $+/-0.05$ degrees Celsius. As DUT 20 is tested over a predetermined temperature range, a characterization of its dielectric constant versus temperature can be read and plotted by a computer (not shown).

As those skilled in the art already know, a ferroelectric material is a dielectric material that exhibits spontaneous polarization and hysteresis between polarization and field. Thus, the reference to ferroelectric material or DUT 20 refers to such a material.

What is claimed is:

1. A device for providing automated measurements of the electrical characteristics of ferroelectric materials, comprising:

a temperature controller module having a temperature plate electrically coupled to a thermoelectric cooler, a water-cooled heat sink electrically connected to said thermoelectric cooler, and a precision temperature sensor positioned on the surface of said temperature plate;

a quick mount fixture having a bottom surface thermally coupled to said surface of said temperature plate directly above said precision temperature sensor, a thermal greased top surface opposite said bottom surface, and a spring-loaded removable hold-down bar that screws into said thermal greased top surface to hold the ferroelectric material being measured between said thermally greased top surface and said hold-down bar, said thermal grease forming a quick-connect and reliable thermal contact between the ferroelectric material being tested and said temperature controlled plate.

2. The device of claim 1 wherein the device is placed in a humidity-free chamber to minimize exposure of said ferroelectric material to air and to maximize the accuracy of the automated measurements of the ferroelectric material.

* * * * *